(12) United States Patent
Bieling et al.

(10) Patent No.: US 10,948,828 B2
(45) Date of Patent: Mar. 16, 2021

(54) ILLUMINATION OPTICAL ELEMENT FOR PROJECTION LITHOGRAPHY

(71) Applicant: Carl Zeiss SMT GmbH, Oberkochen (DE)

(72) Inventors: Stig Bieling, Aalen (DE); Markus Deguenther, Florstadt (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/925,018

(22) Filed: Jul. 9, 2020

(65) Prior Publication Data
US 2020/0341385 A1    Oct. 29, 2020

Related U.S. Application Data

(63) Continuation of application No. PCT/EP2019/050057, filed on Jan. 3, 2019.

(30) Foreign Application Priority Data

Jan. 23, 2018  (DE) .......................... 102018201010.2

(51) Int. Cl.
G03F 7/20          (2006.01)
G02B 27/09         (2006.01)

(52) U.S. Cl.
CPC ..... *G03F 7/70075* (2013.01); *G02B 27/0927* (2013.01); *G02B 27/0994* (2013.01); *G03F 7/7015* (2013.01)

(58) Field of Classification Search
CPC ............ G02B 27/0927; G02B 27/0994; G03F 7/70075; G03F 7/70091; G03F 7/7015; G03F 7/70191; G03F 7/702
(Continued)

(56) References Cited

U.S. PATENT DOCUMENTS 6,285,443 B1   9/2001 Wangler et al.
6,704,092 B2   3/2004 Shiraishi
(Continued)

FOREIGN PATENT DOCUMENTS

DE        195 20 563 A1   12/1996
DE    10 2008 041 288 A1    4/2009
(Continued)

OTHER PUBLICATIONS

German Examination Report, with translation thereof, for corresponding Appl No. 10 2018 201 010.2, dated Sep. 17, 2018.
(Continued)

*Primary Examiner* — Colin W Kreutzer
(74) *Attorney, Agent, or Firm* — Fish & Richardson P.C.

(57) ABSTRACT

An illumination optical unit for projection lithography serves to illuminate an object field along an illumination light beam path. The illumination optical unit includes an optical rod with end-side entrance and exit areas. The optical rod is designed in such a way that illumination light is mixed and homogenized at lateral walls of the optical rod by multiple instances of total internal reflection. An optical rod illumination specification element is disposed upstream of the optical rod in the illumination light beam path and serves to specify an illumination of the entrance area with a distribution, specified over the entrance area, of an illumination intensity and, simultaneously, an illumination angle distribution. The specified illumination intensity distribution deviates from a homogeneous distribution over the entrance area. This can result in an illumination optical unit including an optical rod, in which a specified illumination setting can be set with lower illumination light losses.

20 Claims, 13 Drawing Sheets

(58) Field of Classification Search
USPC .................................................. 355/67, 71
See application file for complete search history.

(56) References Cited

U.S. PATENT DOCUMENTS

| | | | |
|---|---|---|---|
| 6,733,165 B2 | 5/2004 | Van Der Lei et al. | |
| 7,209,218 B2 | 4/2007 | Kawakami et al. | |
| 2002/0196629 A1* | 12/2002 | Terashi | G03F 7/70075 362/331 |
| 2003/0038931 A1 | 2/2003 | Toyoda et al. | |
| 2006/0126049 A1* | 6/2006 | Deguenther | G03F 7/70091 355/69 |
| 2007/0052953 A1* | 3/2007 | Hill | G01N 21/4738 356/237.2 |
| 2008/0273186 A1* | 11/2008 | Brotsack | G03F 7/70108 355/67 |

FOREIGN PATENT DOCUMENTS

| | | |
|---|---|---|
| DE | 10 2007 055 443 A1 | 6/2009 |
| DE | 10 2009 016 456 A1 | 12/2009 |
| DE | 102009029132 A1 * | 11/2010 |
| EP | 1 217 450 A2 | 6/2002 |
| JP | 2007/027240 A | 2/2007 |
| WO | WO 2003/046663 A2 | 6/2003 |
| WO | WO 2005/006079 A1 | 1/2005 |
| WO | WO 2009/024164 A | 2/2009 |

OTHER PUBLICATIONS

Translation of International Search report for corresponding Appl No. PCT/EP2019/050057, dated Apr. 24, 2019.

* cited by examiner

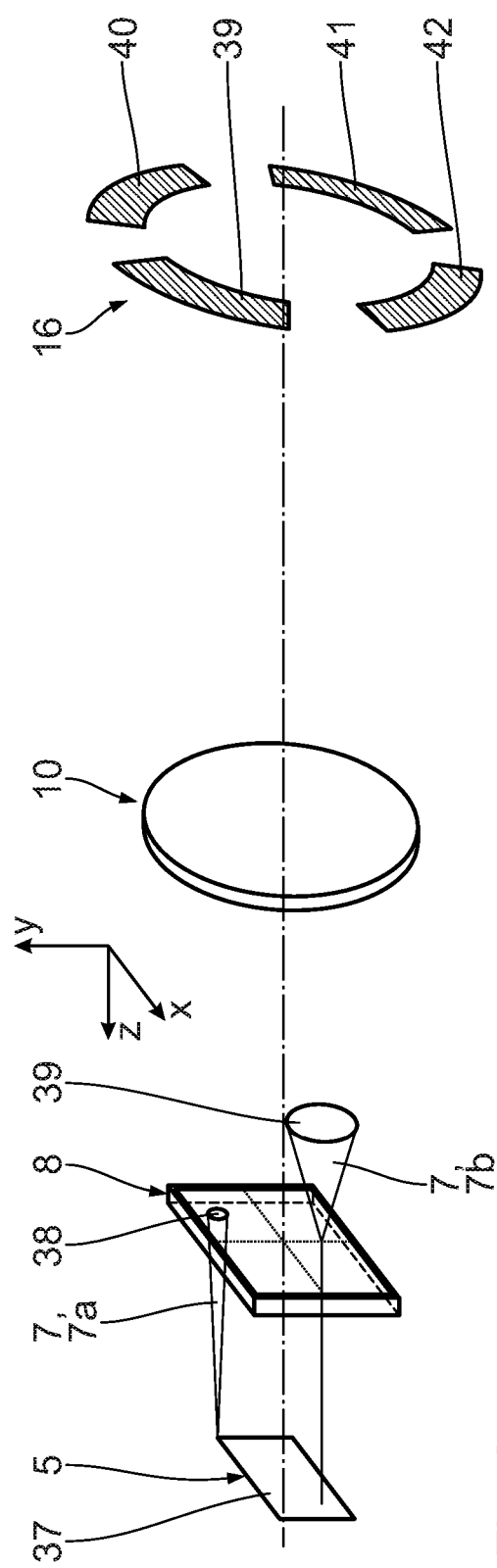
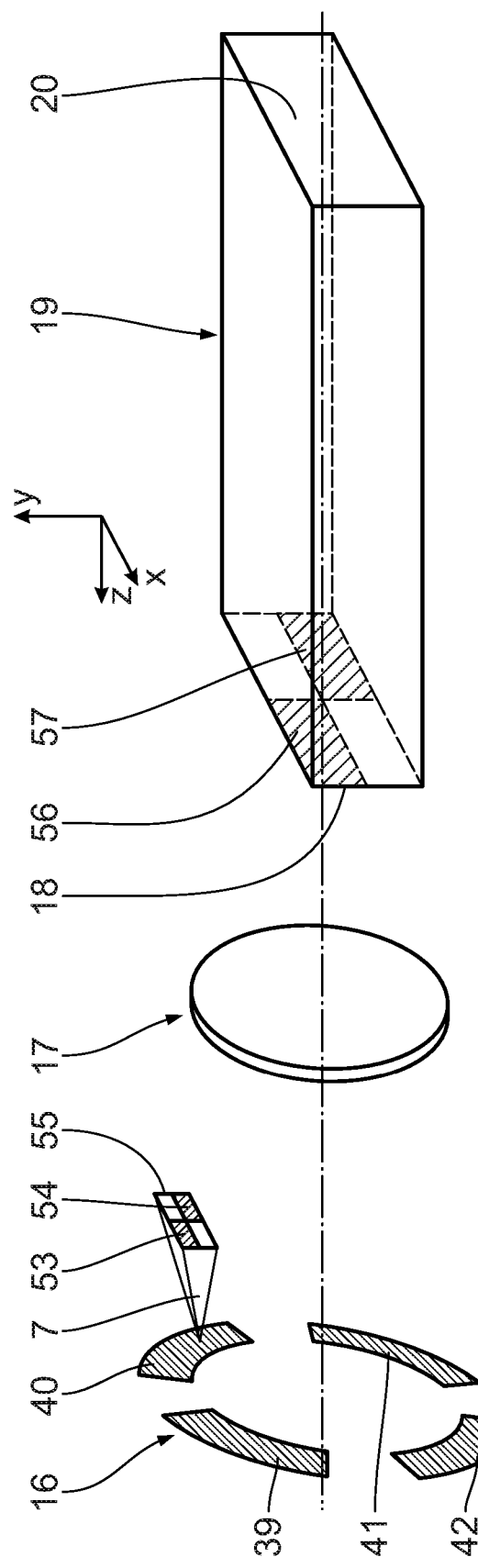
Fig. 2
Fig. 3

ILLUMINATION OPTICAL ELEMENT FOR PROJECTION LITHOGRAPHY

CROSS-REFERENCE TO RELATED APPLICATIONS

The present application is a continuation of, and claims benefit under 35 USC 120 to, international application PCT/EP/2019/050057, filed Jan. 3, 2019, which claims benefit under 35 USC 119 of German Application No. 10 2018 201 010.2, filed Jan. 23, 2018. The entire disclosure of these applications are incorporated by reference herein.

FIELD

The disclosure relates to an illumination optical unit for projection lithography. Furthermore, the disclosure relates to an optical system including such an illumination optical unit, an illumination system including such an optical system, and a projection exposure apparatus including such an illumination system.

BACKGROUND

Illumination optical units for projection lithography are known from DE 195 20 563 A1. Further illumination optical units are known from WO 2005/006079 A1, WO 2003/046663A2, DE 10 2007 055 443 A, U.S. Pat. No. 7,209,218 A, US 2003/0038931 A, U.S. Pat. No. 6,704,092 A, WO 2009/024 164 A and JP 2007/27240 A.

SUMMARY

The present disclosure seeks to develop an illumination optical unit with an optical rod for mixing and homogenizing the illumination light, such that a specified illumination setting can be set with lower illumination light losses.

In a general aspect, the disclosure provides an illumination optical unit for projection lithography for illuminating an object field along an illumination light beam path. The illumination optical unit includes an optical rod with an end-side entrance area for illumination light and with an opposing, end-side exit area for the illumination light. The optical rod is designed in such a way that the illumination light is mixed and homogenized at lateral walls of the optical rod by multiple instances of total internal reflection. The illumination optical unit includes an optical rod illumination specification element, upstream of the optical rod in the illumination light beam path, for specifying an illumination of the entrance area with a distribution, specified over the entrance area of an illumination intensity and, simultaneously, an illumination angle distribution. The illumination specification by the optical rod illumination specification element is such that the specified illumination intensity distribution deviates from a homogeneous distribution over the entrance area According to the disclosure, it was identified that it is desirable to set not only an illumination angle distribution at the rod entrance but also an illumination intensity distribution over the rod entrance surface for the purposes of the low-loss adaptation of an illumination of an optical rod. Additionally, it was identified that it is possible to illuminate the rod on the entrance side with illumination directions that do not correspond to those of the desired illumination setting provided care is taken that such rod entrance beam directions that do not fit the desired illumination setting are radiated on to the right positions of the rod entrance area.

The optical rod illumination specification element can have a diffractive embodiment or else a refractive/diffractive embodiment. On account of the optical rod illumination specification element, the illumination light entering into the rod can be used effectively for providing the desired illumination setting. Then, it is possible for little light or even no light to be blocked at a possible subsequent correction stop in an illumination pupil plane.

The optical rod illumination specification element can be configured so that, for a given beam direction of the illumination light upon coupling into the entrance area, the specified illumination intensity distribution deviates over the entrance area from a homogeneous distribution in such a way that sections of the entrance area are not impinged by illumination light. Such an arrangement can provide a particularly good effectiveness in the provision of the desired illumination setting.

The optical rod illumination specification element can be disposed in a pupil plane of the illumination optical unit. Such an arrangement can lead to an advantageous specialization of the effect of this rod illumination specification element to an illumination angle.

The illumination optical unit can include an intensity specification element, disposed upstream of the optical rod illumination specification element, for specifying an illumination intensity distribution on the optical rod illumination specification element. Such an intensity specification element can ensure the intensity dependence for specifying the illumination setting, particularly if the optical rod illumination specification element only acts on the illumination angle. The intensity specification element can have a diffractive embodiment. An illumination intensity distribution on the optical rod illumination specification element can have a targeted inhomogeneous form due to the intensity specification element and can contain a fine structure or division, which follows from the rod geometry. This fine structure can be generated by way of orders of diffraction generated by the intensity specification element. The illumination intensity distribution on the optical rod illumination specification element can demonstrate imaging aberrations of an input coupling optical unit for coupling the illumination light into the entrance area.

The optical rod illumination specification element can be disposed in a far field of the intensity specification element. Such an arrangement of the optical rod illumination has proven its worth.

The illumination optical unit can include an axicon in the illumination light beam path between the intensity specification element and the optical rod illumination specification element. Such an axicon can facilitate shaping, such as additional shaping, of an illumination intensity distribution on the optical rod illumination specification element. The axicon could be embodied as a zoom axicon.

The illumination optical unit can include at least one pupil correction stop in the illumination light beam path downstream of the optical rod. This can facilitate a final fine correction of the specified illumination setting.

The illumination optical unit can include an interchange holder for exchanging the intensity specification element and/or the rod illumination specification element with at least one further specification element. Such an interchange holder can facilitate an adaptation of the effects of the optical rod illumination specification element and/or of the intensity specification element to a desired illumination angle distribution or desired illumination setting. Instead of changing the respective specification element, the latter can also be extended and retracted between a correction position and a neutral position such that there can be a respective position of the interchange holder in which none of the assigned specification elements has an optical effect.

The illumination optical unit can include an interchange holder drive for the driven specification element exchange. Such an interchange holder drive can facilitate an automated operation of the respective interchange holder. The interchange holder drive can be signal-connected to a central control device of the illumination optical unit.

An optical system can include an illumination optical unit according to the disclosure and a projection optical unit for imaging the object field into an image field. An illumination system can include such an optical system and a light source. A projection exposure apparatus can include such an illumination system, a reticle holder for holding a reticle in an object plane, a projection lens for imaging the object field into an image field in an image plane, and a wafer holder for holding a wafer in the image plane. Advantages of such embodiments can correspond to those that have already been explained above with reference to the illumination optical unit according to the disclosure. The illumination system can have a DUV (deep ultraviolet) light source.

In particular, a microstructured or nanostructured component, especially a semiconductor chip, for example a memory chip, can be produced using the projection exposure apparatus.

BRIEF DESCRIPTION OF THE DRAWINGS

Exemplary embodiments of the disclosure are explained in greater detail below with reference to the drawings, in which:

FIG. 2 schematically and in a perspective view shows exemplary sub-beams of illumination light of the projection exposure apparatus en route between a light source and an optical rod illumination specification element;

FIG. 3 shows, in an illustration similar to FIG. 2, an indicated beam profile of a sub-beam of the illumination light between the optical rod illumination specification element and an optical rod of the illumination optical unit of the projection exposure apparatus;

EXEMPLARY EMBODIMENTS OF THE DISCLOSURE

Figure 1:
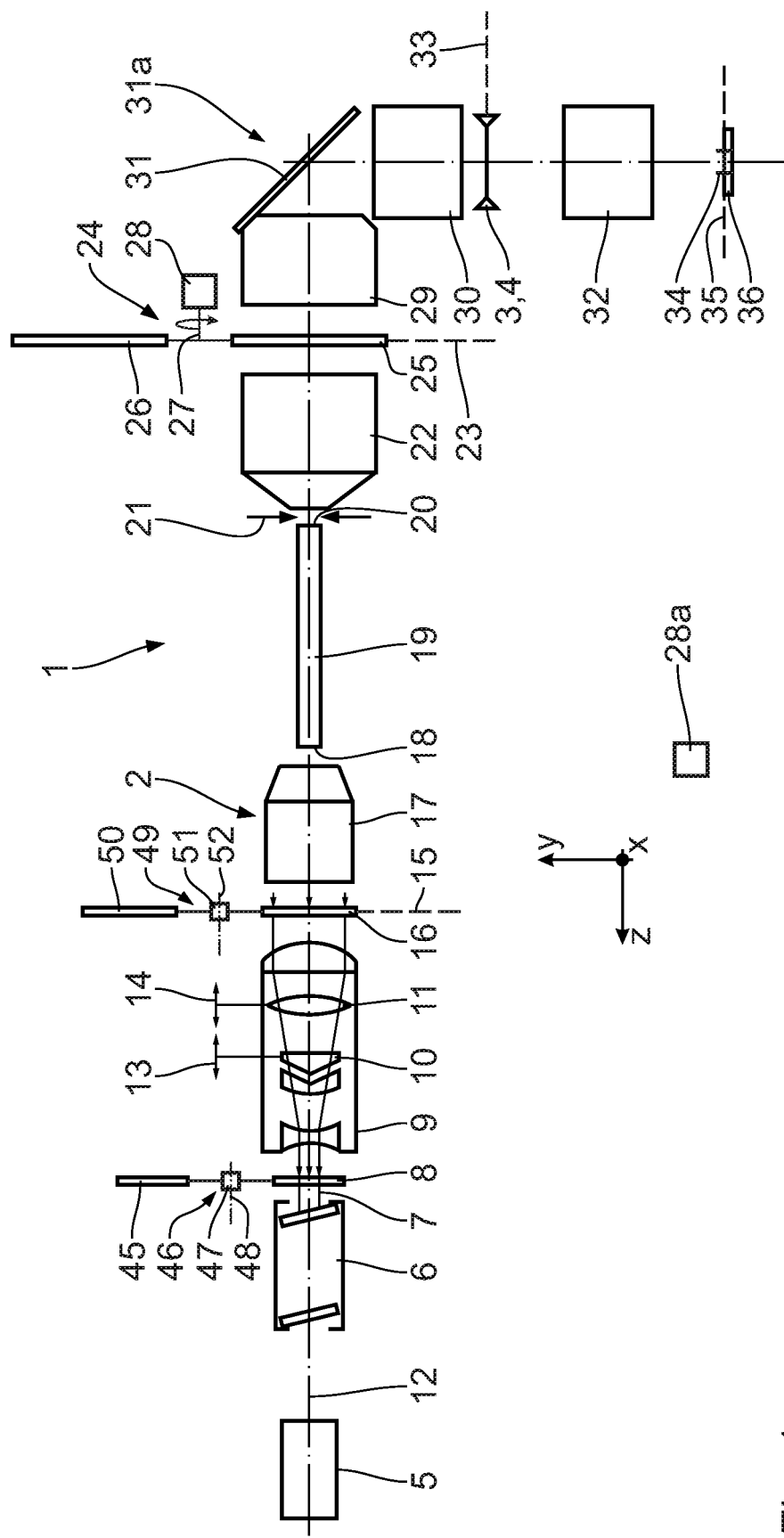
FIG. 1 shows a schematic overview of a microlithographic projection exposure apparatus in a meridional section.
Figure 4:
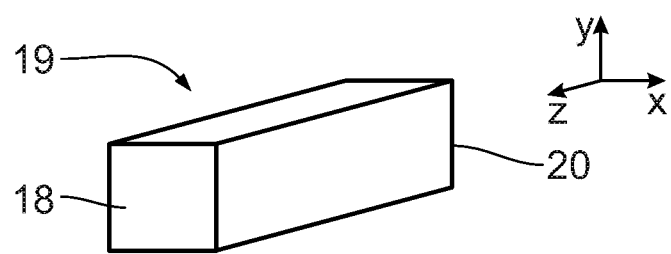
FIG. 4 shows the optical rod for elucidating the relative position of coordinate axes of a Cartesian xyz-coordinate system in a perspective view.

In order to elucidate positional relationships, a Cartesian xyz-coordinate system is specified in the drawing. In FIG. 1, the x-axis extends perpendicular to the plane of the drawing out of the latter. The y-axis extends upward in FIG. 1. The z-axis extends to the left in FIG. 1.

A microlithographic projection exposure apparatus 1 has an illumination system with an illumination optical unit 2 for illuminating a defined illumination and object field 3 at the location of an object and a reticle 4, which represents a template to be projected for the production of microstructured or microelectronic semiconductor components. The reticle 4 is held by a reticle holder, not shown here.

A laser in the deep ultraviolet (DUV) is used as a light source 5 for illumination light of the illumination system. This could be an ArF excimer laser. Other DUV sources are also possible.

A beam expander 6, for example a mirror arrangement known from DE-A 41 24 311, is used to reduce coherence and generate an expanded, collimated, rectangular cross section of a beam of the illumination light 7.

A first diffractive optical raster element (DOE) 8 is disposed in an object plane of a condenser 9. This DOE 8 is also referred to hereinafter as intensity specification element. The condenser 9 includes an axicon pair 10 and a lens element 11 with a positive focal length. The spacing of the axicon elements of the axicon pair 10 from one another and the position of the lens element 11 are adjustable along an optical axis 12 of the illumination optical unit 2, as indicated by double-headed arrows 13, 14 in FIG. 1. Therefore, the condenser 9 represents a zoom optical unit.

A further diffractive and/or refractive optical raster element (ROE) 16 is disposed in an exit pupil plane 15 of the condenser 9. To the extent that the raster element 16 has a diffractive embodiment, it could be embodied as a computer-generated hologram (CGH), for example. As an alternative or in addition to the embodiment as a diffractive optical element, the ROE 16 can have a refractive embodiment, for example as a refractive optical raster element, in particular as a microlens array. Although a diffractive embodiment is also possible, the raster element 16 is denoted as ROE below.

Using the first DOE 8, a defined intensity distribution in the pupil plane 15 is set at the location of the ROE 16. This generates a specified so-called illumination setting, i.e., a defined distribution of illumination angles over the object field 3. Therefore, the first DOE 8 represents an illumination angle specification element for specifying an illumination angle distribution over the object field 3.

An input coupling optical unit 17 disposed downstream of the ROE 16 transmits the illumination light to an end-side entrance area 18 of a transparent optical rod in the form of a glass rod 19. The rod 19 mixes and homogenizes the illumination light by multiple internal reflection at the lateral walls of the rod 19. An intermediate field plane in which a reticle masking system (REMA) 21, an adjustable field stop, is disposed is located directly on an end-side exit area 20 of the rod 19 lying opposite the entrance area 18.

The ROE 16 is used, inter alia, to adapt the cross-sectional shape of the illumination beam 7 to the rectangular shape of the entrance area 18 of the rod 19.

The ROE 16 is also referred to hereinafter as optical rod illumination specification element. The ROE 16 serves to specify an illumination of the entrance area 18 of the rod 19 by way of the illumination light 7. The illumination of the entrance area 18 is specified in such a way that this specifies the distribution of the illumination intensity and, simultaneously, the illumination angle distribution over the entrance area 18. The specified illumination intensity distribution over the entrance area 18 deviates from a homogeneous distribution, as is yet to be explained in more detail below.

The DOE 8, i.e., the intensity specification element, is used to specify an illumination intensity distribution on the ROE 16, i.e., on the optical rod illumination specification element.

A condenser 22 is disposed downstream of the REMA 21. A stop interchange holder 24 with a plurality of stops or filters can be disposed in an exit pupil plane 23 of the condenser 22, two stops 25, 26 of the plurality of stops or filters being illustrated in FIG. 1. The stop interchange holder 24 carries the various stops in the style of a stop carousel. For the purposes of changing the stop, the carousel is driven about a drive shaft 27 of a drive motor 28, which is signal-connected to a central control device 28*a* of the projection exposure apparatus 1. The stops of the stop interchange holder 24 are subdivided into an even number of separate stop sections. The stop sections could be stops completely blocking the illumination light, neutral density filters attenuating the illumination light by a predetermined percentage or polarization filters linearly polarizing the illumination light.

A further condenser with lens-element groups 29, 30 is displaced downstream of the pupil plane 23 disposed downstream of the rod 19. A 90° deflection mirror 31 for the illumination light is disposed between the two lens-element groups 29, 30. The condenser 22 and the further condenser with the two lens-element groups 29, 30 form a lens 31*a*, which images the intermediate field plane of the REMA 21 onto the reticle 4. The pupil plane 23 represents an internal pupil plane of this lens 31*a*.

A projection lens 32 images the object field 3, which lies in an object plane 33, into an image field 34 in an image plane 35. The image field 34 is part of the surface of a wafer 36 to be exposed, which is provided with a coating that is sensitive to the illumination light. The wafer 36 is held by a wafer holder, not shown here. During projection exposure, the reticle 4 and the wafer 36 are scanned synchronously with one another. An intermittent displacement of the holder of the reticle 4 and of the wafer 36, a so-called stepper operation, is also possible.

With the exception of the deflection mirror 31, the various beam-guiding or beam-shaping components of the projection exposure apparatus 1 are indicated as refractive components. However, these could equally be catadioptric or reflective components.

The effects of the DOE 8 on the one hand and of the ROE 16 on the other hand are explained in more detail below on the basis of FIGS. 2 and 3.

FIG. 2 shows a beam path of selected sub-beams of the illumination light 7 between the light source 5 and the ROE 16. In turn, FIG. 3 shows the beam path of a selected sub-beam of the illumination light 7 between the ROE 16 and the entrance area 18 of the optical rod 19.

In FIG. 2, a sub-beam 7*a* of the illumination light 7 emanates in exemplary fashion with a low initial divergence from a point on an emission surface 37 of the light source 5 and strikes the DOE 8 in the region of an incidence spot 38 with a comparatively small extent. A further sub-beam 7*b* of the illumination light 7 is illustrated as emanating from a point on the DOE 8 in FIG. 2. On account of the diffractive effect of the DOE 8, an intensity substructure that can be used to specify a structuring of an illumination of the ROE 16 arises in a far field 39 of this further sub-beam. The ROE 16 is disposed accordingly in a far field of the DOE 8.

The zoom axicon pair 10, which is indicated by a lens element in FIG. 2, is disposed between the DOE 8 and the ROE 16.

Spatial illumination of the ROE 16, elucidated to the right in FIG. 2, arises as a combination of the effects of the divergence of the light source 5, of the DOE 8, and of the axicon pair 10.

Figure 11:
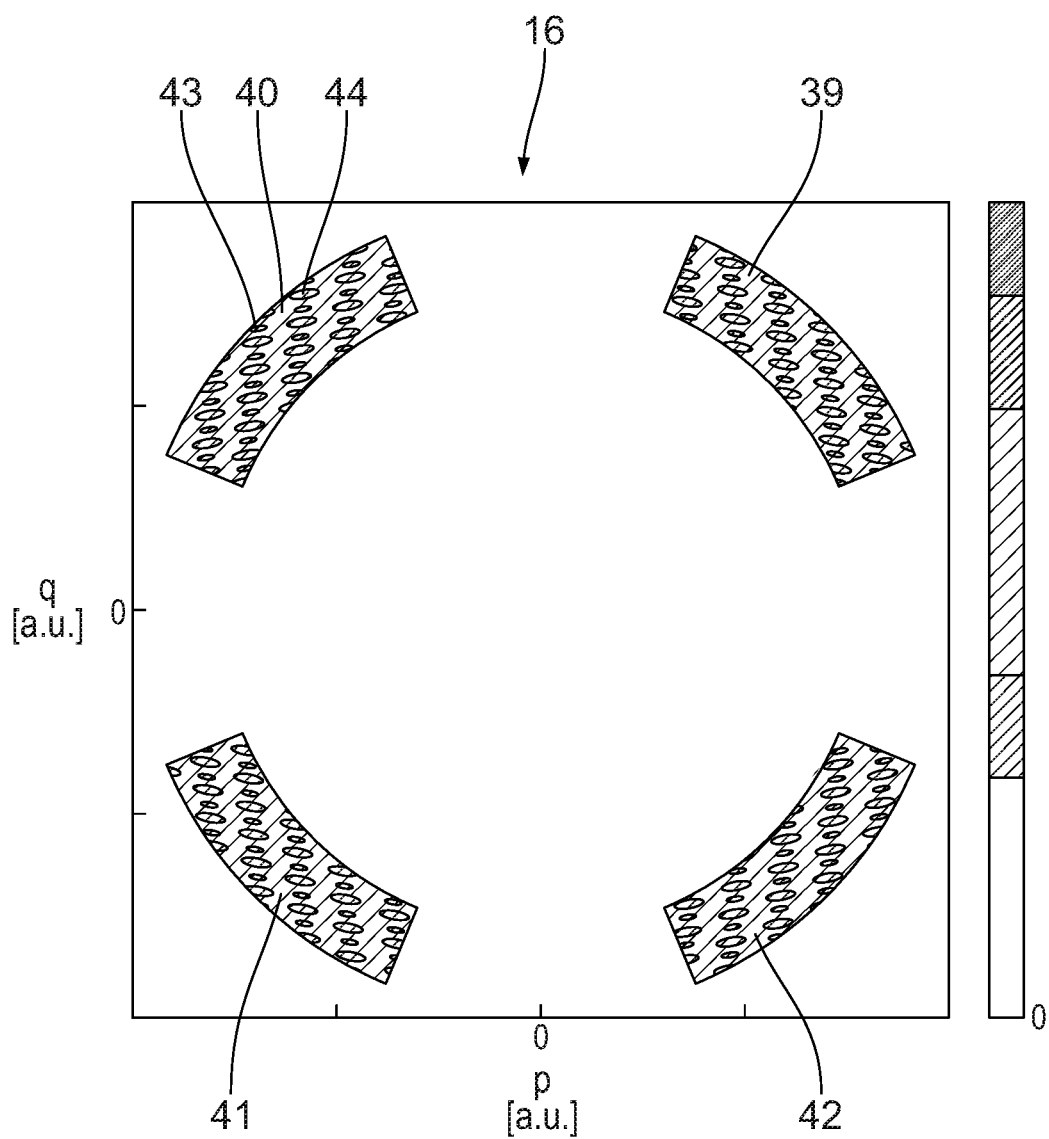
FIG. 11 shows a location illumination of the optical rod illumination specification element, which, in conjunction with an illumination angle distribution emanating from this optical rod illumination specification element, leads to the illumination setting according to FIG. 10.

In exemplary fashion, FIG. 11 shows this illumination of the ROE 16 according to FIG. 2 in greater detail. Four partly circular illumination regions 39, 40, 41, 42, which are disposed in the four quadrants of the ROE 16, are illuminated. Within these four illumination regions 39 to 42, an illumination intensity is characteristically divided into more intensive and less intensive lots. A more intensive lot is denoted 43 in FIG. 11 and a less intensive lot is denoted 44. In FIG. 11, an illumination intensity of the ROE 16 is specified by an intensity scale, plotted on the right, in arbitrary units.

The division 43, 44 emerges from the geometry of the optical rod 19.

A fine structuring in the far field 39, by which that division 43, 44 can be brought about, is generated by way of different orders of diffraction of the DOE 8.

The illumination intensity distribution over the illumination regions 39 to 42 on the ROE 16 can demonstrate imaging aberrations of the input coupling optical unit 17 during the input coupling into the optical rod 19.

The DOE 8 is embodied for interchange with at least one further DOE 45 (cf. FIG. 1) by way of a DOE interchange holder 46 with an interchange holder driver with a drive motor 47 for rotating the DOE interchange holder carousel about a drive shaft 48. This allows the effect of the DOE to be set to desired specifications, for example for adaptation to a desired illumination setting. There could also be a position of the DOE interchange holder 47 in which no DOE acts in the beam path of the illumination light 7.

Accordingly, the illumination optical unit 2 has an ROE interchange holder 49 for exchanging the ROE 16 for at least one further ROE 50. A drive motor 51 and a drive shaft 52 of the ROE interchange holder 49 correspond to those components that were described above in conjunction with the DOE interchange holder 46. There could also be a position of the ROE interchange holder 49 in which no ROE acts in the beam path of the illumination light 7.

FIG. 3 elucidates an emission angle characteristic of the ROE 16. A sub-beam of illumination light 7, which emanates from a point on the illumination region 40, is illustrated in exemplary fashion. The emission angle characteristic of the ROE 16 is such that the emitted sub-beam emits the illumination light 7 into two emission quadrants 53, 54 of an overall approximately rectangular emission cross section 55. An x/y aspect ratio of the emission cross section 55 corresponds to the x/y aspect ratio of the entrance area 18 of the optical rod 19.

The input coupling optical unit 17, in turn indicated in FIG. 3 by a lens element, converts the emission angle characteristic generated by the ROE 16 into an illumination intensity distribution on the entrance area 18 of the rod 19. Then, entrance area sections 56, 57 of the entrance area 18, which are impinged with the illumination light 7 by the ROE 16 from the direction of the emission point considered in FIG. 3, correspond to the two illuminated emission quadrants 53, 54.

A different emission characteristic can be generated by each emission point on the illumination regions 39 to 42 of the ROE 16. The specification detailing which emission angle characteristic should be emitted by what emission points of the ROE 16 so that the desired illumination setting results is explained below.

Figure 10:
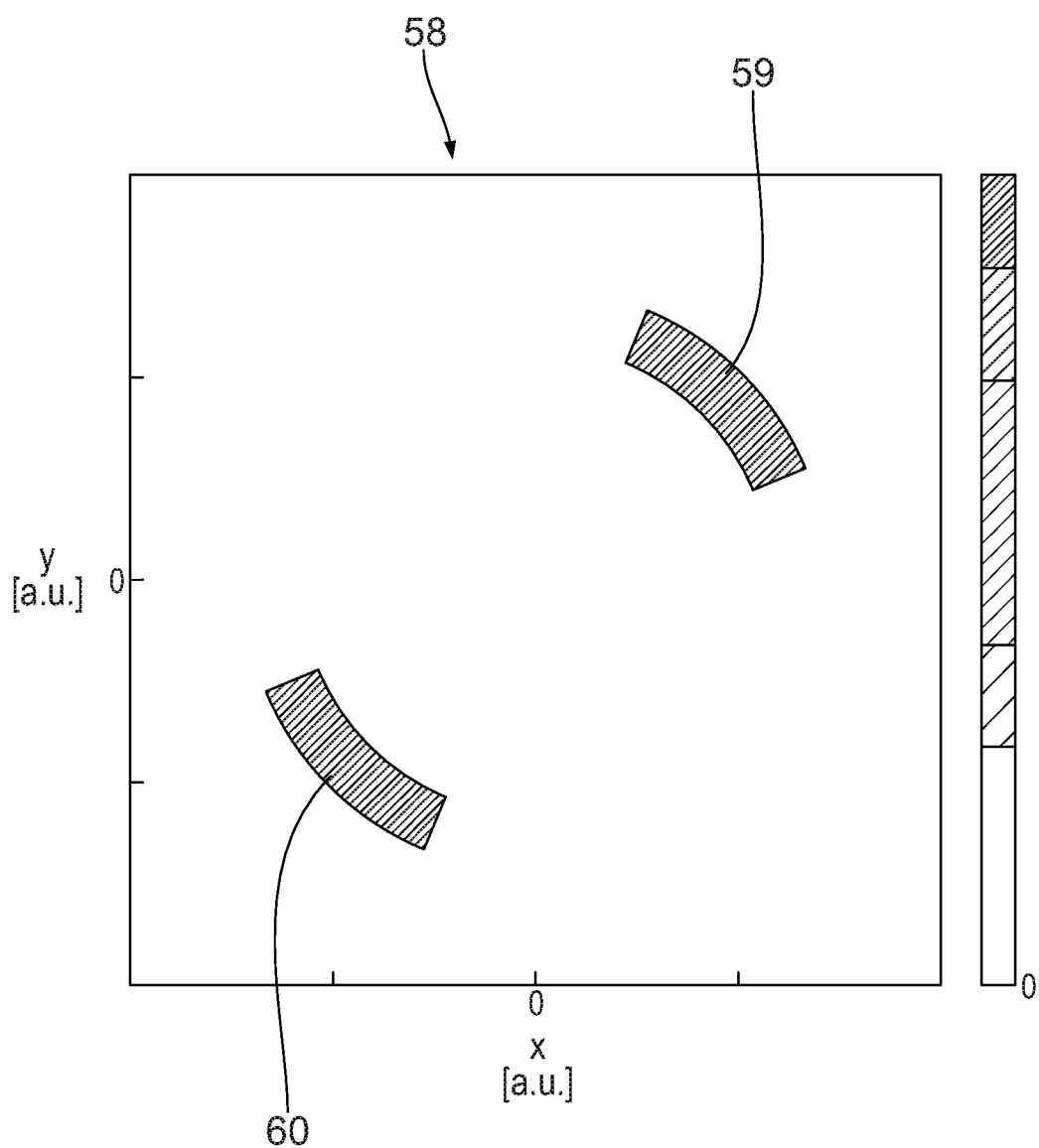
FIG. 10 shows a further exemplary illumination setting, which should be present in a pupil plane of the illumination optical unit following the exit from the optical rod.

Such a desired illumination setting 58, which results on account of the emission characteristic according to FIGS. 2, 3 and 11, is illustrated in FIG. 10. This illumination setting 58 is a dipole setting with two partly circular illumination poles 59, 60 which are disposed in the first and third quadrant of the intensity distribution in the region of the pupil plane 23, which is illustrated in FIG. 10. It should be noted that the spatial distribution of the illumination of the ROE 16 according to FIG. 11 with four illumination regions 39 to 42 generates this dipole illumination setting 58 with two illumination poles 59, 60, without this requiring, e.g., the blocking of two poles, as is the case in the prior art. This is achieved by the targeted combination of spatial illumination and emission angle characteristic of the ROE 16.

Figure 5:
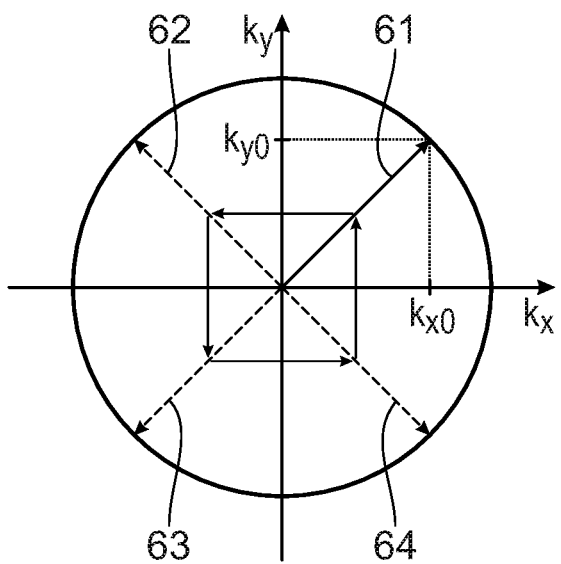
FIG. 5 schematically shows, in a beam direction diagram with beam direction components $k_x$, $k_y$ which are assigned to the Cartesian coordinates x, y, conditions when coupling an illumination beam into the rod, the illumination beam being reflected at all four lateral walls of the rod.

FIG. 5 elucidates how the direction of an illumination beam with a direction vector $k_{x0}$, $k_{y0}$, which enters the optical rod 19, changes (direction vector 61) in the case of the reflection at the four lateral walls of the optical rod 19. The beam initially passes through the entrance area 18 in such a way that its beam direction has both a positive x-direction component and a positive y-direction component. Following the reflection at the first lateral wall, the x-component of the beam direction is reversed whereas the y-component is maintained (direction vector 62). During the second reflection at the second lateral wall, it is now the y-direction that is reversed, but not the x-direction, and so the direction vector 63 results. The third reflection once again reverses the x-direction but not the y-direction, and so the direction vector 64 results. The fourth reflection returns the direction vector 64 to the direction vector 61. Provided the beam incident with the direction vector 61 experiences exactly four reflections (or an integer multiple of this number of reflections) at the inner lateral walls of the rod 19, it therefore leaves the exit area 20 with exactly the same direction it had upon entry into the entrance area 18.

Figure 6:
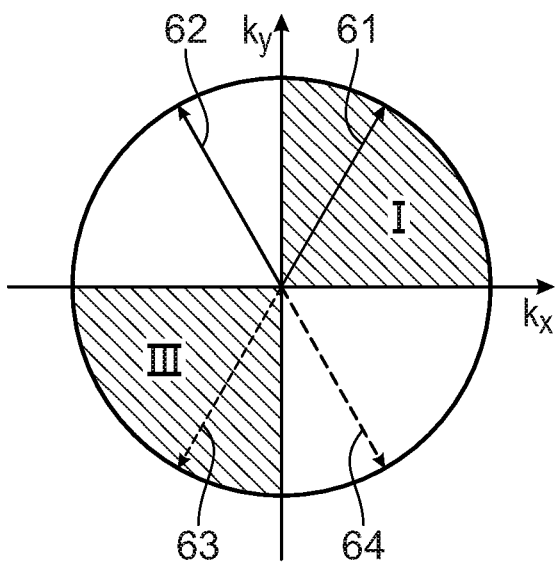
FIG. 6 shows, in a diagram as per FIG. 5, a comparison between a desired illumination setting (45° dipole) and the beam directions at the four reflections as per FIG. 5.

FIG. 6 elucidates how many reflections such a beam with an incident direction vector 61 with a positive $k_x$-component and a positive $k_y$-component may experience at the lateral faces of the optical rod so that a 45 dipole illumination setting with illuminated quadrants I and III, desired in this case, arises. In comparison with FIG. 5, it becomes evident that an illumination beam entering the rod with the direction vector 61 in this way either is not be reflected at the lateral walls or may experience an even number of reflections at the lateral walls of the rod 19 so that the illumination beam either has a beam direction suitable for quadrant I (direction vector 61) or has a beam direction suitable for quadrant III (direction vector 63) of the desired illumination setting. An odd number of reflections at the lateral walls of the rod would not lead to direction vectors 62 or 64 suitable for the desired illumination setting.

Figure 7:
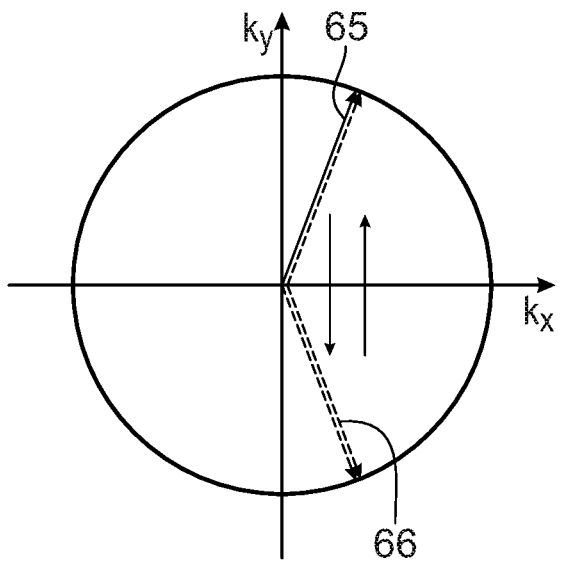
FIGS. 7 and 8 show, in illustrations similar to FIGS. 5 and 6, the conditions in the case of an input coupling beam direction into the optical rod where the illumination beam is only reflected by an upper and a lower lateral wall of the optical rod.
Figure 8:
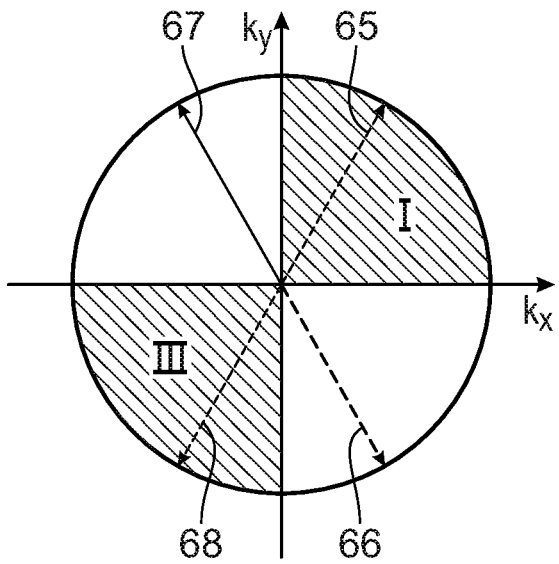

FIGS. 7 and 8 show the conditions in which the illumination beam with a direction vector 65 with a positive x-component and a positive y-component of the beam direction is incident in such a way that it is only reflected by the upper or lower lateral wall of the rod 19. Here, the direction vector is converted into a direction vector 66 with an inverted y-sign and an unchanged x-sign during a first reflection and converted back to itself, i.e., to the direction vector 65, during the subsequent reflection. What emerges accordingly is that in order to reach the desired setting either no reflection or an even number of reflections is allowed in such a situation (reflections only on opposite lateral faces). An odd number of reflections would lead to the unwanted direction vector 66.

It is evident from FIG. 8 that an illumination beam (direction vector 67) entering the optical rod with initially an unwanted beam direction with respect to the desired setting could lead to a desired direction vector 68 in the case of an odd number of reflections at the lateral walls of the rod 19 (situation where there are only reflections at opposite lateral walls of the rod) or could lead to a desired direction vector 65 (in the case of reflections at other lateral walls of the rod as well).

Figure 9:
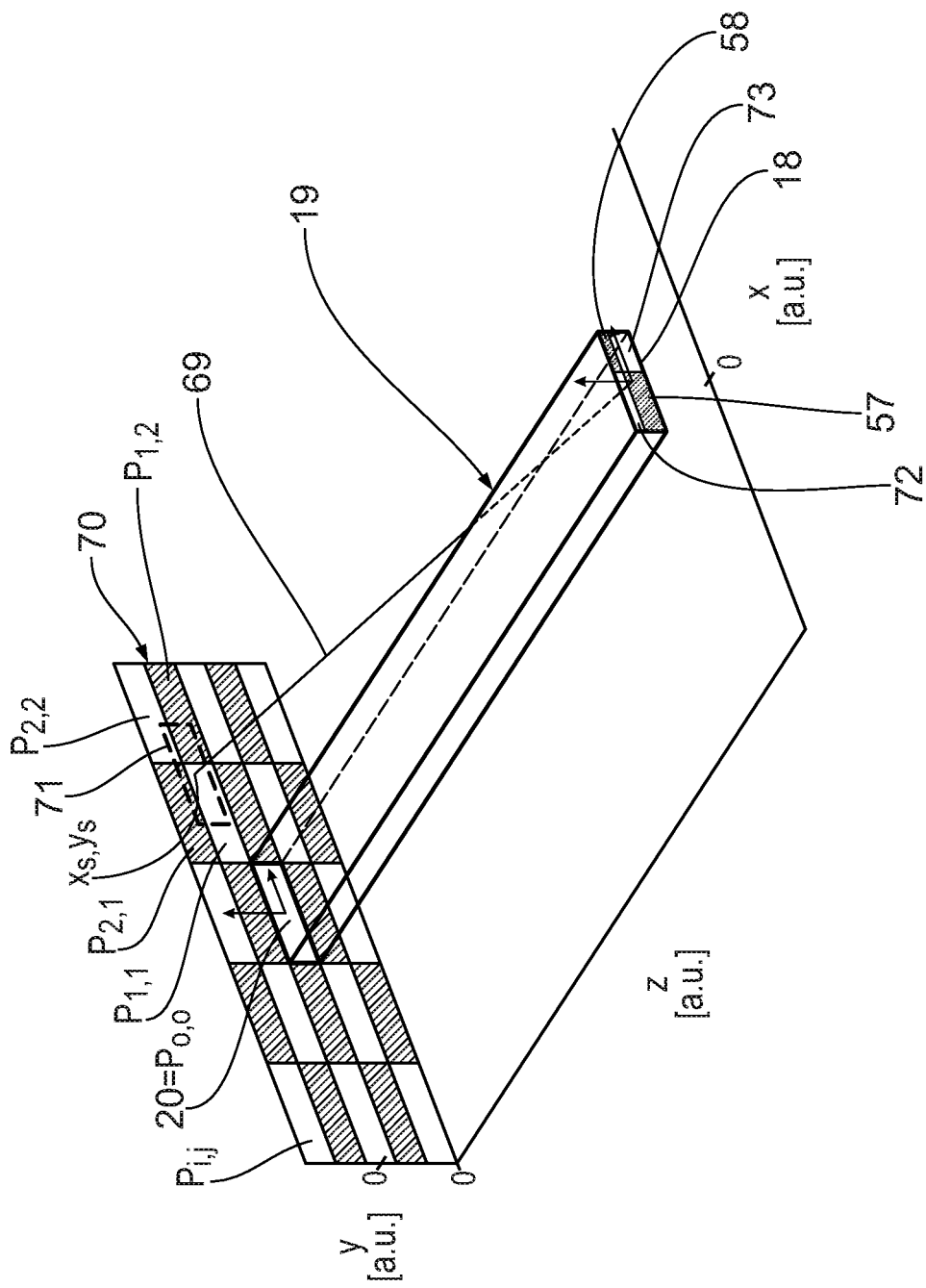
FIG. 9 shows a schematic illustration of the optical rod and a fanned-open exit area plane, which can be used to ascertain respectively allowed input coupling beam directions and allowed input coupling locations, assigned to the respective input coupling beam direction, on the rod entrance area, i.e., to ascertain a specification of an illumination of the entrance area in respect of an illumination intensity present over the entrance area and, at the same time, an illumination angle distribution present over the entrance area.

FIG. 9 shows an arrangement which can be used to decide which beam direction of the illumination light 7 at the entrance into the rod 19 sections of the entrance area 18 belong to, which sections can be impinged by the illumination light so that the desired illumination setting results. In FIG. 9, this is illustrated for exactly one beam direction 69 of the illumination light 7. This beam direction intersects an exit plane 70, in which the exit area 20 is located, at one point $x_s$, $y_s$. The beam with the beam direction 69, which extends through the center of the entrance area 18, is considered here.

The exit plane 70 is subdivided into xy-coordinate lots $P_{i,j}$, the area of which is just as large as the exit area 20 and which form a tessellation without gaps in the exit plane 70. The coordinates x, y in each of the coordinate lots $P_{i,j}$ represent beam directions of exactly one type of reflections at the lateral walls of the optical rod 19.

The exit area 20 simultaneously forms the coordinate lot $P_{0,0}$. Beams of the illumination light 7 with a beam direction whose point of intersection ends in the lot $P_{0,0}$ experience no reflections at the lateral walls of the rod 19.

Provided a deflection on account of the reflection at the lateral walls remains unconsidered, all beams with the beam direction 69 are incident on the exit plane 70 in a region of incidence 71, which is illustrated in FIG. 9 using dashed lines. This region of incidence 71 is located in the lots $P_{1,1}$, $P_{1,2}$, $P_{2,1}$, and $P_{2,2}$. The point $x_s$, $y_s$ itself is located in the lot $P_{1,1}$, i.e., in a lot with exactly two reflections at the rod lateral walls.

In the case of a combination of target illumination setting and considered beam direction 69 illustrated in FIG. 9, even numbers of reflections at the rod lateral walls are admissible, i.e., lead to beam directions of the illumination light 7 upon exit from the exit area 20 that fit to the desired illumination setting, as explained above in conjunction with FIGS. 5 to 8. All beams with the beam direction 69 whose points of intersection are located in the intersection of the region of incidence 71 and the lot $P_{1,1}$ are therefore beam directions that contribute to the allowed illumination setting. Thus, the ROE 16 is designed in such a way that illumination light 7 is radiated into the entrance area section 57 of the entrance area 18 with the beam direction 69.

A corresponding statement applies to the intersection between the region of incidence 71 and the lot $P_{2,2}$, which likewise belongs to an even number of reflections of the illumination light with the beam direction 69 at the lateral walls of the rod 19. This intersection is part of the entrance area region 58.

The two other, remaining rectangular entrance area sections 72, 73 need not be impinged with illumination light with the beam direction 69 for the purposes of obtaining the target illumination setting since these correspond to the coordinate lots $P_{2,1}$ and $P_{1,2}$, i.e., belong to lots with an odd number of reflections at the rod lateral walls.

The treatment of the beam direction 69 can now be repeated for all other beam directions that belong to the target illumination setting, for example to the illumination setting 58, and also to beam directions complementary thereto (cf. illumination regions 40 and 42 of the ROE 16, in which then an odd number of reflections at the rod lateral walls leads to desired illumination directions, as likewise explained above in conjunction with FIGS. 5 to 8).

In the case of such beam directions, which do not fit to the illumination setting per se, intersections of the respective region of incidence with the coordinate lots which belong to lots with an odd number of reflections are then considered, for example the lots $P_{1,2}$ and $P_{2,1}$ of the example above. By way of example, should the beam direction 69 not be a beam direction occurring in the illumination setting 58, the division of the entrance area 18 into entrance area sections to be illuminated and entrance area sections not to be illuminated would be precisely reversed and the entrance area sections 72, 73 should be illuminated while the entrance area sections 57 and 58 would precisely not be intended for illumination.

For the respective locations $x_s$, $y_s$ in the exit plane 70, the following relationship can be specified as a function from the respective emission location p, q and the beam direction $k_p$, $k_q$ when proceeding from this location p, q:

$$x_S(p, q, k_p) = k_p f + \frac{Lp}{\sqrt{f^2 n_S^2 - p^2 - q^2}}$$

$$y_S(p, q, k_q) = k_q f + \frac{Lq}{\sqrt{f^2 n_S^2 - p^2 - q^2}}$$

Here:
$x_s$, $y_s$: are the coordinates of the point of intersection, representing the beam direction in the region of the rod entrance, of this beam direction in the exit area plane 70;
p, q: spatial coordinates of the ROE 16;
$k_p$, $k_q$: emission direction vector components of the respective beam of the illumination light 7, proceeding from the point p, q at the ROE 16;
f: focal length of the input coupling optical unit 17;
L: length of the rod 19, i.e., distance between entrance area 18 and exit area 20;
$n_s$: refractive index of the optical material of the rod 19.

Also, the aforementioned constraint that there may be an even number of reflections at the lateral rod walls for beam directions at the rod entrance which belong to the desired illumination setting and there is an odd number of reflections at the lateral rod walls for the other beam directions, which therefore do not fit to the illumination setting, applies to the coordinates $x_s$, $y_s$.

A condition for the structuring of the ROE 16 can be specified from the formulae above.

Figure 12:
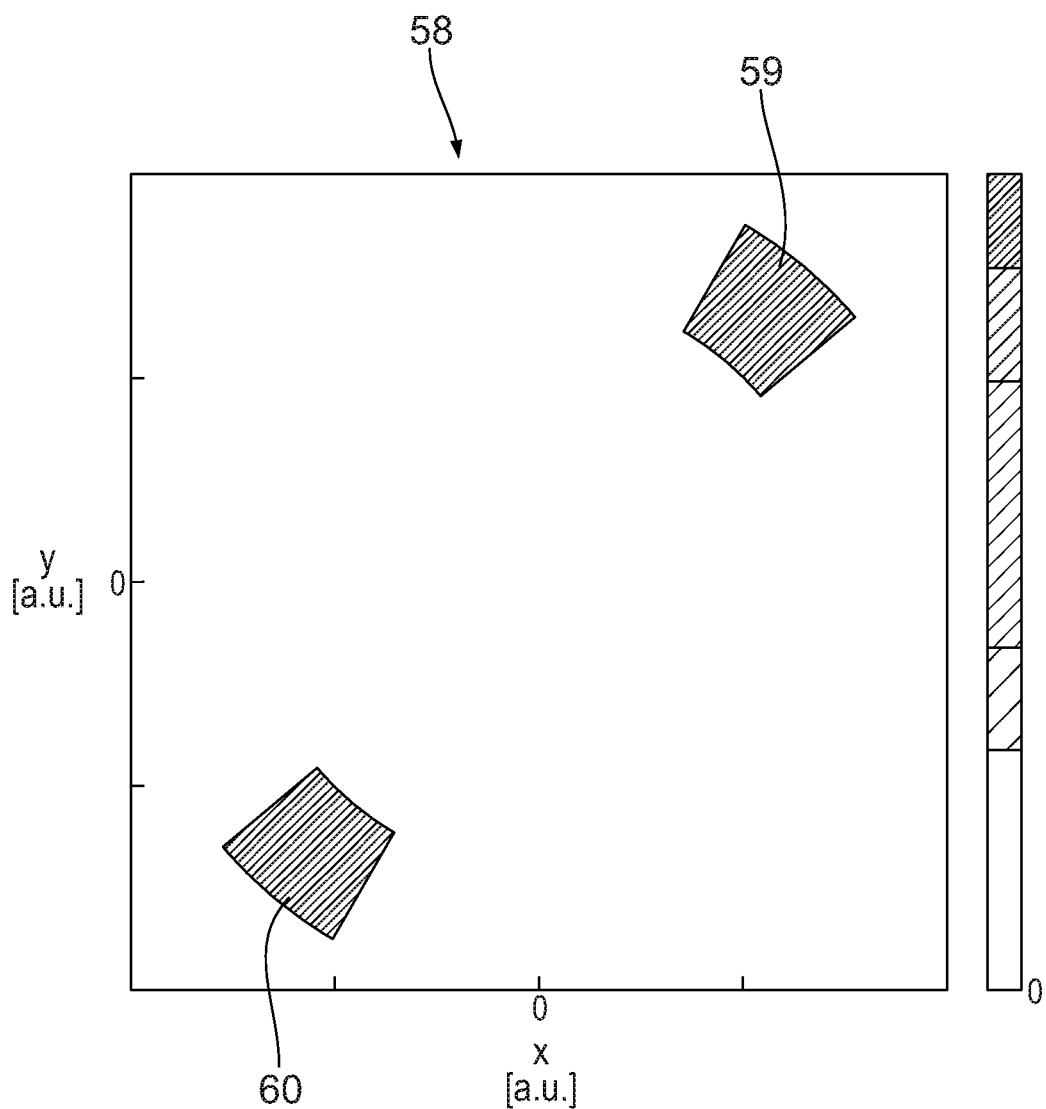
FIG. 12 to 17 show illustrations similar to FIGS. 10 and 11 of target illumination settings and assigned target location illuminations of the optical rod illumination specification element, which, in conjunction with illumination angle distributions then respectively emanating from the optical rod illumination specification element, lead to these target illumination settings.
Figure 13:
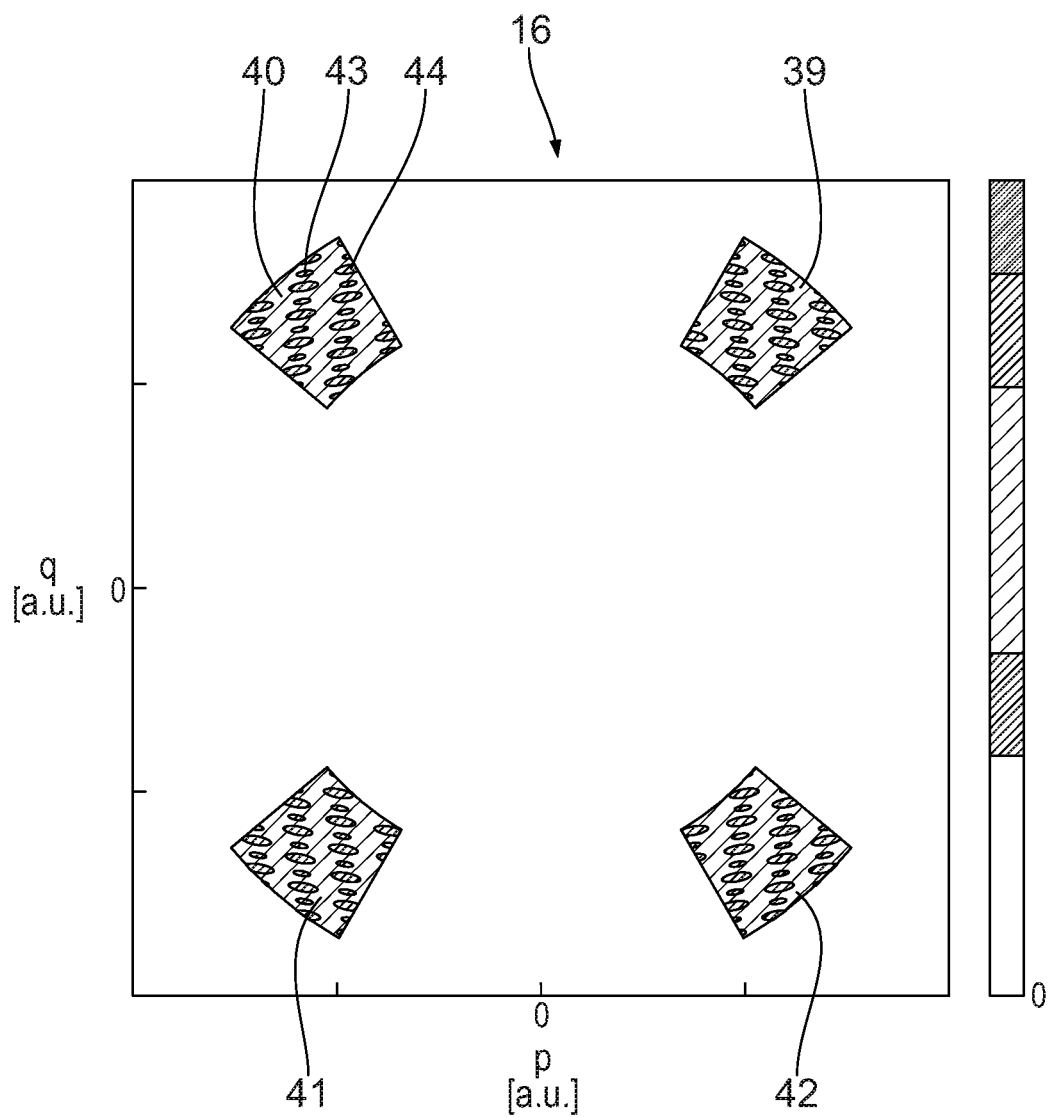
Figure 14:
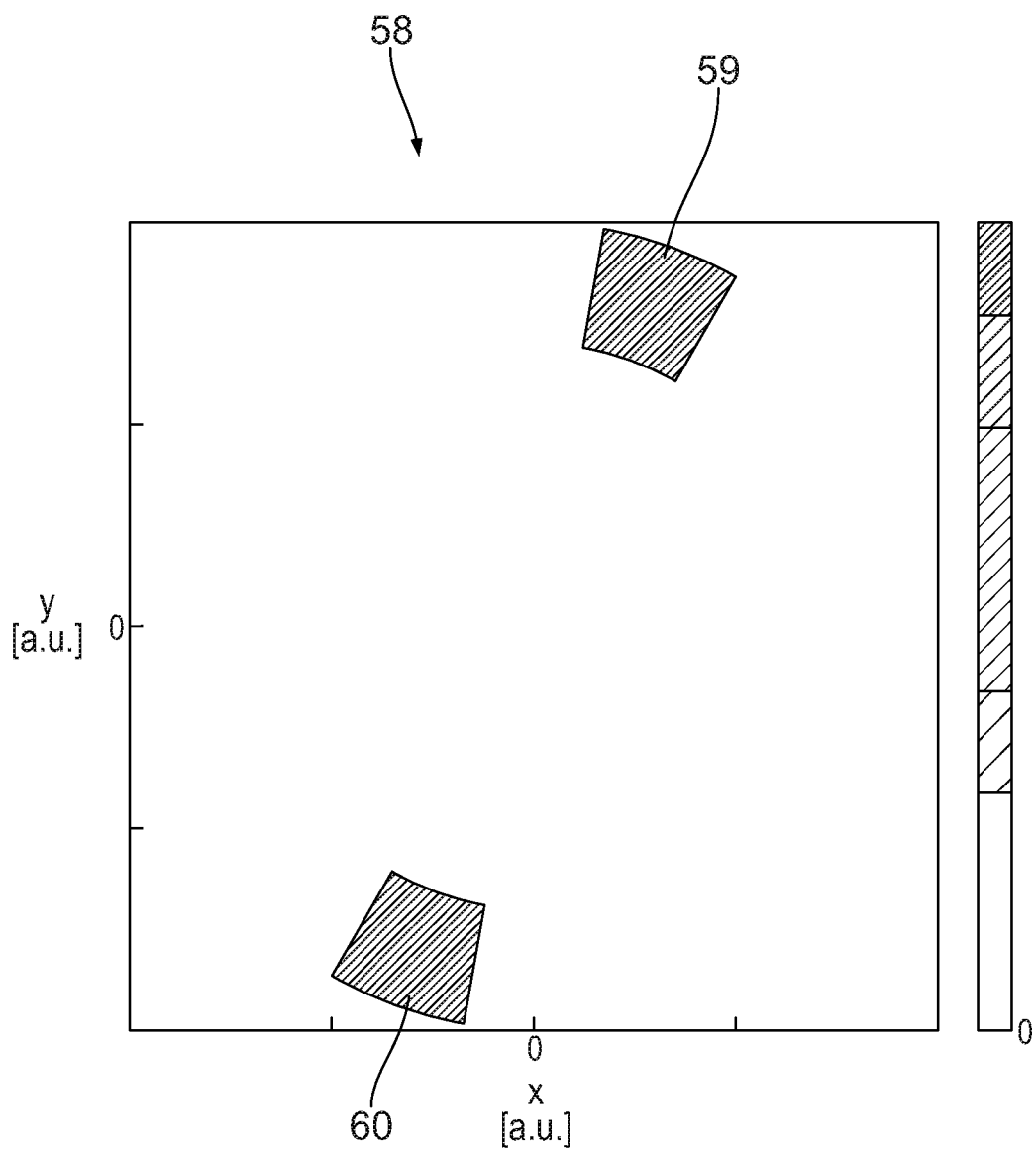
Figure 15:
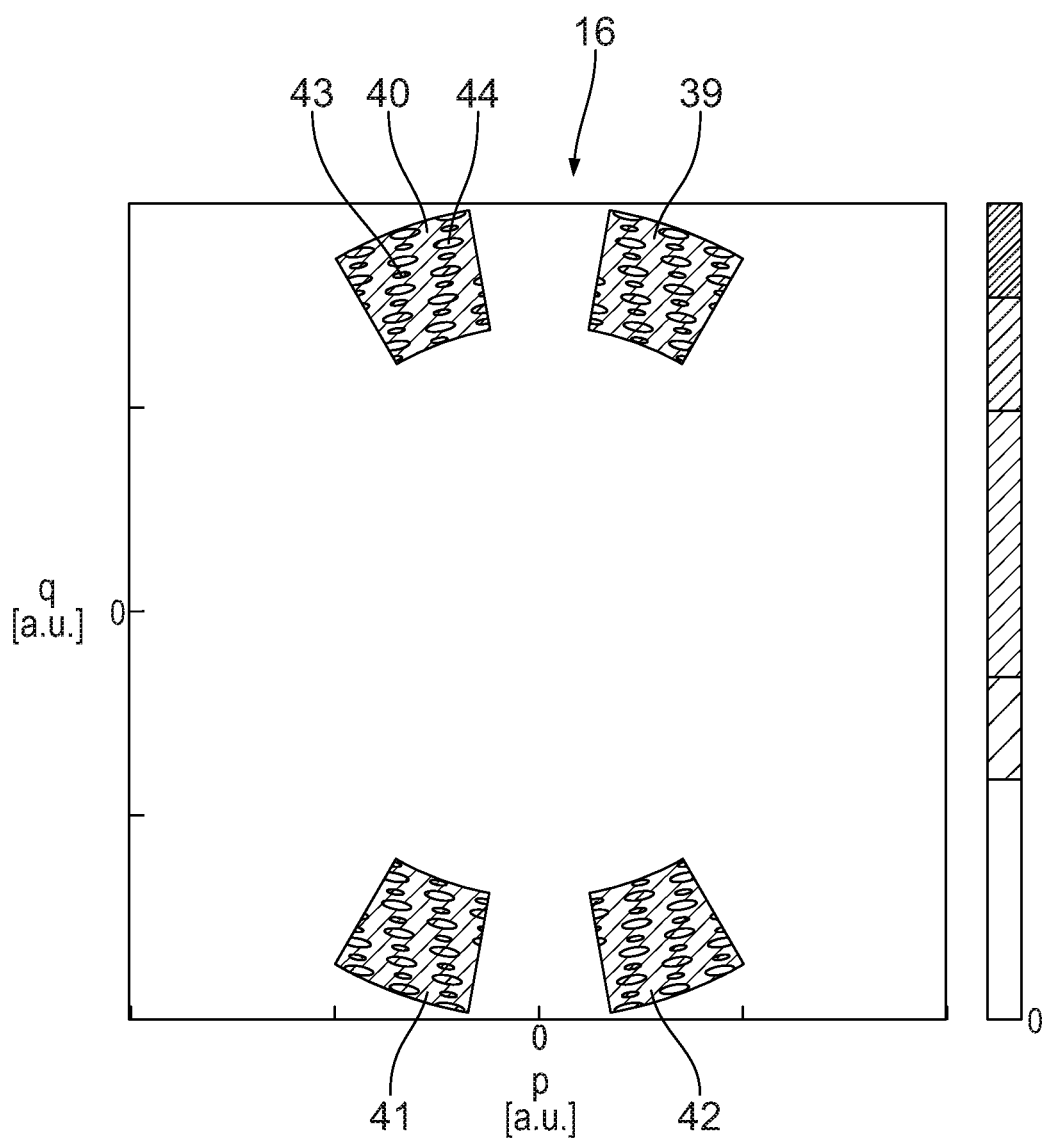
Figure 16:
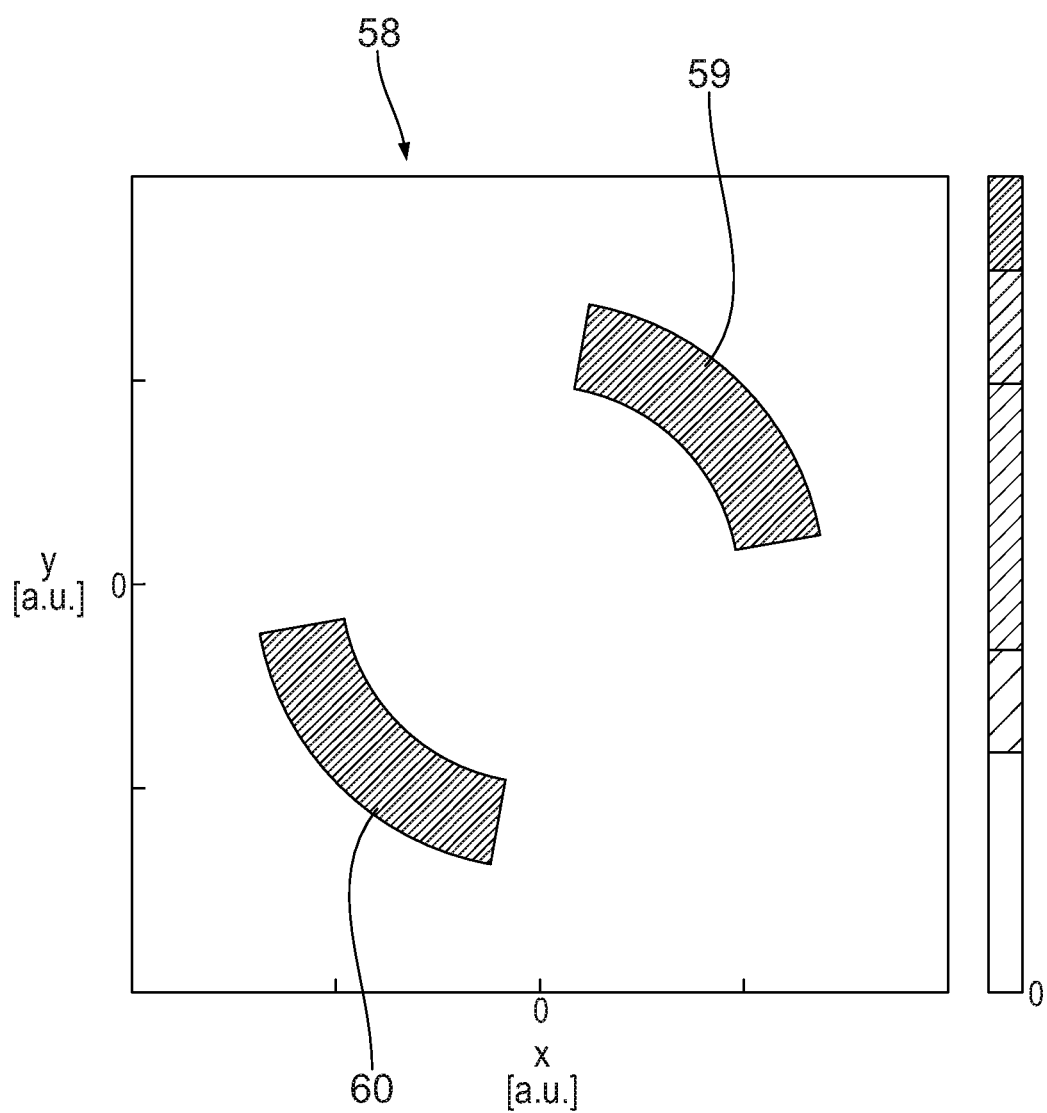
Figure 17:
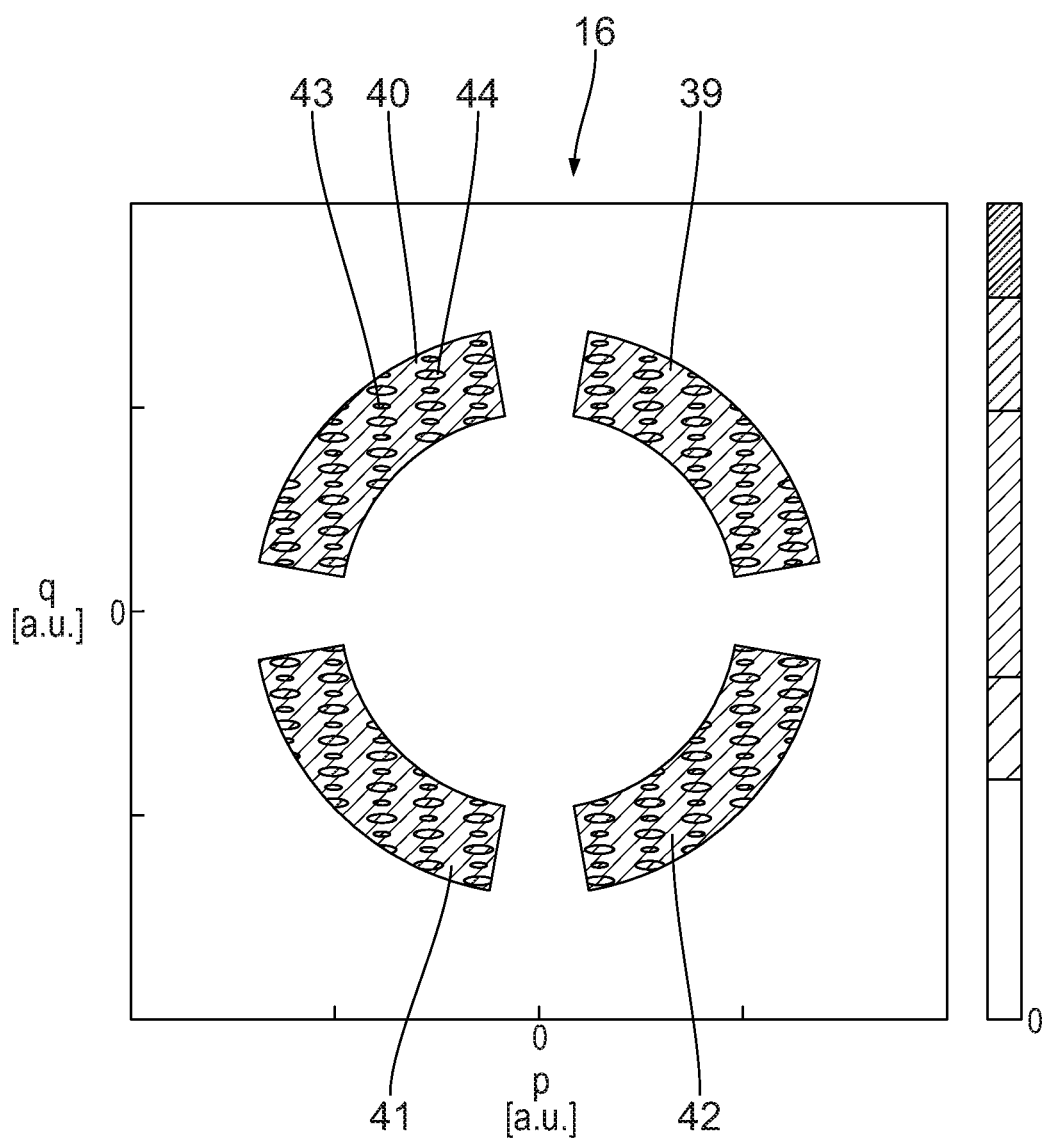

FIGS. 12 to 17 show three further variants of dipole illumination settings, each with illumination poles 59, 60 with different arrangement positions within the quadrants I and III, and with different azimuthal extents. These illumination settings according to FIGS. 12, 14, and 16 have assigned the respective spatial illuminations of the ROE 16 in an illustration corresponding to that of FIG. 11 in FIGS. 13, 15, and 17. Once again, these illuminations are provided with an intensity scale. Like for the spatial illumination of the ROE 16 for generating the illumination setting 58 according to FIG. 10, the dipole settings according to FIGS. 12, 14, and 16 are also such that the spatial illumination at the ROE 16 according to FIGS. 13, 15, and 17 respectively has four illumination regions.

Figure 18:
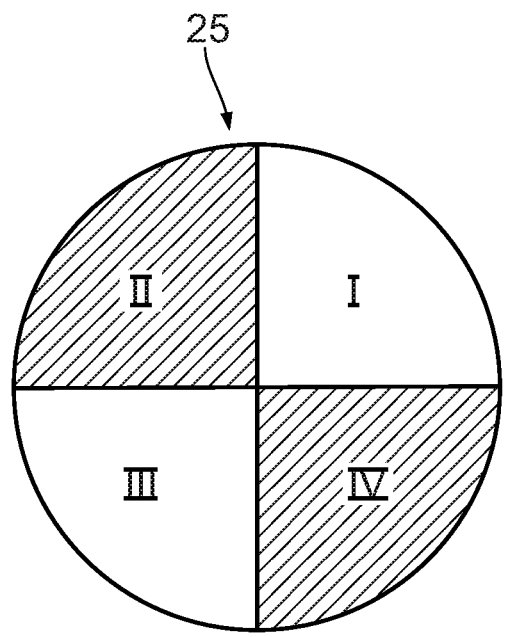
FIGS. 18 and 19 show two embodiments of an aperture stop in exemplary fashion, which aperture stop could be disposed in a pupil plane of the illumination optical unit in the illumination light beam path downstream of the optical rod.
Figure 19:
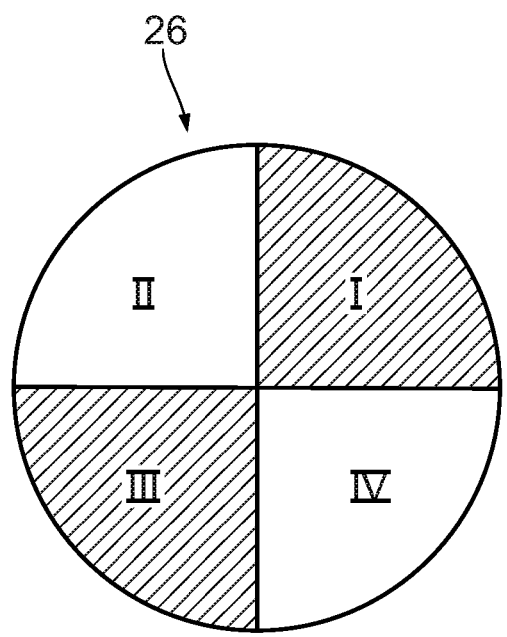

FIGS. 18 and 19 show examples of the filters or stops 25 and 26. In the filter 25, quadrants I and III have a transparent embodiment and quadrants II and IV have an opaque or blocking embodiment. The filter or the stop 26 emerges by rotating the stop 25 through 90° about its center. Thus, in the stop 26, the quadrants I and III have an opaque or blocking embodiment and the quadrants II and IV are transparent. The stops 25, 26 are used as pupil correction stops.

In the microlithographic production of a microstructured or nanostructured component, the wafer 36 is initially coated, at least in sections, with a light-sensitive layer. Then, a structure on the reticle 4 is projected onto the wafer 36 using the projection exposure apparatus 1. Then, the exposed wafer 36 is processed for forming the microstructured component.

What is claimed is:
1. An illumination optical unit configured to illuminate an object field along an illumination light beam path, the illumination optical unit comprising:
   an optical rod, comprising:
      an end-side entrance area for illumination light; and
      an end-side exit area for the illumination light, the end-side exit area opposing the end-side entrance area; and
   an optical rod illumination specification element upstream of the optical rod in the illumination light beam path, wherein:
      the optical rod is configured so that, during use, the illumination light is mixed and homogenized at lateral walls of the optical rod by multiple instances of total internal reflection;
      the optical rod illumination specification element is configured to specify an illumination of the end-side entrance area with a distribution, specified over the end-side entrance area, of: i) an illumination intensity; and ii) simultaneously, an illumination angle distribution; and
      the illumination specification by the optical rod illumination specification element is such that the specified illumination intensity distribution deviates from a homogeneous distribution over the entrance area.

2. The illumination optical unit of claim 1, wherein the optical rod illumination specification element is configured so that, for a given beam direction of the illumination light upon coupling into the end-side entrance area, the specified illumination intensity distribution deviates over the end-side entrance area from a homogeneous distribution so that sections of the end-side entrance area are not impinged by illumination light.

3. The illumination optical unit of claim 1, wherein the optical rod illumination specification element is in a pupil plane of the illumination optical unit.

4. The illumination optical unit of claim 1, further comprising an intensity specification element upstream of the optical rod illumination specification element, wherein the intensity specification element is configured to specify an illumination intensity distribution on the optical rod illumination specification element.

5. The illumination optical unit of claim 4, wherein the optical rod illumination specification element is in a far field of the intensity specification element.

6. The illumination optical unit of claim 5, further comprising an axicon in the illumination light beam path between the intensity specification element and the optical rod illumination specification element.

7. The illumination optical unit of claim 1, further comprising a pupil correction stop in the illumination light beam path downstream of the optical rod.

8. The illumination optical unit of claim 1, further comprising an interchange holder configured to exchange the intensity specification element and/or the rod illumination specification element with a further specification element.

9. The illumination optical unit of claim 8, further comprising an interchange holder drive configured to drive the specification element exchange.

10. An optical system, comprising:
an illumination optical unit according to claim 1; and
a projection optical unit configured to image the object field into an image field.

11. An illumination system, comprising:
a light source; and
an optical system, comprising:
an illumination optical unit according to claim 1; and
a projection optical unit configured to image the object field into an image field.

12. An apparatus, comprising:
an illumination system, comprising:
a light source; and
an optical system, comprising:
an illumination optical unit according to claim 1; and
a projection optical unit configured to image the object field into an image field;
a first holder configured to hold a first object in the object plane; and
a second holder configured to hold a second object in the image plane.

13. An illumination optical unit configured to illuminate an object field along an illumination light beam path, the illumination optical unit comprising:
an optical rod, comprising:
an end-side entrance area for illumination light; and
an end-side exit area for the illumination light, the end-side exit area opposing the end-side entrance area; and
a first element upstream of the optical rod in the illumination light beam path,
wherein:
the optical rod is configured so that, during use, the illumination light is mixed and homogenized at lateral walls of the optical rod by multiple instances of total internal reflection; and
the first element is configured to specify an illumination over the end-side entrance area, of: i) a non-homogeneous illumination intensity; and ii) simultaneously, an illumination angle distribution.

14. The illumination optical unit of claim 13, wherein the first element is configured so that, for a given beam direction of the illumination light upon coupling into the end-side entrance area, sections of the end-side entrance area are not impinged by illumination light.

15. The illumination optical unit of claim 13, wherein the first element is in a pupil plane of the illumination optical unit.

16. The illumination optical unit of claim 13, further comprising a second element upstream of the first element, wherein the second element is configured to specify an illumination intensity distribution on the first element.

17. The illumination optical unit of claim 16, wherein the first element is in a far field of the second element.

18. The illumination optical unit of claim 17, further comprising an axicon in the illumination light beam path between the first and second elements.

19. The illumination optical unit of claim 13, further comprising a pupil correction stop in the illumination light beam path downstream of the optical rod.

20. An illumination optical unit configured to illuminate an object field along an illumination light beam path, the illumination optical unit comprising:
an optical rod, comprising:
an entrance area for illumination light; and
an exit area for the illumination light, the end-side exit area opposing the entrance area; and
a first element upstream of the optical rod in the illumination light beam path,
wherein:
the optical rod is configured so that, during use, the illumination light is mixed and homogenized at lateral walls of the optical rod by multiple instances of total internal reflection; and
the first element is configured to specify an illumination over the entrance area, of i) a non-homogeneous illumination intensity; and ii) simultaneously, an illumination angle distribution.

* * * * *

UNITED STATES PATENT AND TRADEMARK OFFICE
CERTIFICATE OF CORRECTION

PATENT NO. : 10,948,828 B2
APPLICATION NO. : 16/925018
DATED : March 16, 2021
INVENTOR(S) : Stig Bieling and Markus Deguenther It is certified that error appears in the above-identified patent and that said Letters Patent is hereby corrected as shown below:

In the Specification

Column 1, Line 9, delete "PCT/EP/2019/050057," and insert -- PCT/EP2019/050057, --;

Column 1, Lines 52-56, delete "an illumination intensity and, simultaneously, an illumination angle distribution. The illumination specification by the optical rod illumination specification element is such that the specified illumination intensity distribution deviates from a homogeneous distribution over the entrance area" and insert the same on Column 1, Line 51 as a continuation of the same paragraph;

Column 1, Line 56, delete "area" and insert -- area. --;

Column 4, Line 12, delete "FIG." and insert -- FIGS. --;

Column 8, Line 2, delete "45" and insert -- 45° --;

In the Claims

Column 12, Line 54, Claim 20, delete "of" and insert -- of: --.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*